United States Patent [19]
Weinfurtner

[11] Patent Number: 6,094,395
[45] Date of Patent: Jul. 25, 2000

[54] ARRANGEMENT FOR CONTROLLING VOLTAGE GENERATORS IN MULTI-VOLTAGE GENERATOR CHIPS SUCH AS DRAMS

[75] Inventor: Oliver Weinfurtner, Wappingers Falls, N.Y.

[73] Assignee: Infineon Technologies North America Corp., San Jose, Calif.

[21] Appl. No.: 09/253,996

[22] Filed: Feb. 22, 1999

Related U.S. Application Data

[60] Provisional application No. 60/079,717, Mar. 27, 1998.

[51] Int. Cl.$^7$ .................................................. G11C 7/00
[52] U.S. Cl. ................ 365/226; 365/189.09; 365/230.03
[58] Field of Search .......................... 365/226, 230.03, 365/189.05, 230.08, 201, 185.07, 189.09; 327/201, 530

[56] References Cited

U.S. PATENT DOCUMENTS

| | | | |
|---|---|---|---|
| 5,291,455 | 3/1994 | Feng et al. | 365/226 |
| 5,621,685 | 4/1997 | Cernea et al. | 365/185.18 |
| 5,761,145 | 6/1998 | Zagar et al. | 365/226 |
| 5,946,257 | 8/1999 | Keeth | 365/226 |

*Primary Examiner*—David Nelms
*Assistant Examiner*—Gene N. Auduong
*Attorney, Agent, or Firm*—Stenton C. Braden

[57] ABSTRACT

A plurality of voltage generating circuits forming a voltage generator system on a chip are controlled by a centralized voltage generator control arrangement. The voltage generator control arrangement includes a controller with a state machine (52) that receives control signals from various devices on the chip as, for example, a clock generator, voltage detectors, bondpads, testpads, fuses, and predetermined registers. From the received signals, the controller generates control signals to the plurality of generating circuits of the voltage generator system and other circuits on the chip in accordance with a predetermined program sequence for each phase of operation required by the generating circuits to provide the necessary stable voltages to circuits on the chip.

11 Claims, 6 Drawing Sheets

FIG. 4A

| | OCCURRENCE | CONTROLLER | GENERATOR CIRCUITS |
|---|---|---|---|
| 200 | VEXT APPLIED | RESET FLIP FLOPS; V6on IS LOW; bFINIT IS LOW; bFET IS HIGH; | V1A & V1B START; V2 STARTS; V3 STARTS; V4 STARTS; V5 (INITIAL PULLDOWN OF NODE); V7 (INITIAL ACTIVATION OF BOOST SWITCH); V6ac, V6sbm START; V8 STARTS; V8osb STARTS; V9 STARTS; V10 STARTS; |
| 201 | | WAIT X CYCLES | |
| 202 | V13 LEVEL IS OK V6DET GOES HIGH | | |
| 203 | | WAIT X CYCLES | |
| 204 | | V6on GOES HIGH | V3 DRIVE CAPABILITY REDUCED; V5 NO LONGER PULL-DOWN; V7 BOOST TURNED OFF |
| 205 | | V14sbct GOES HIGH; | V14 STARTED; |
| 206 | | V13acct, V13sbct GOES HIGH; | V13ac, V13sb STARTED; |
| 207 | | GENERATION OF FUSE LATCH SIGNALS; bFINIT GOES HIGH; | |
| 208 | | WAIT Y CYCLES | |
| 209 | | bFSET GOES LOW; | |
| 210 | | WAIT Z CYCLES | |
| 211 | | bFSET GOES HIGH; | |
| 212 | V13 LEVEL REACHED V13LMT GOES LOW | V13acct GOES LOW; | V13ac TURNED OFF; |
| 213 | | V12poct GOES HIGH; | V12po STARTED; |

*FIG. 4B*

| | OCCURRENCE | CONTROLLER | GENERATOR CIRCUITS |
|---|---|---|---|
| 214 | V12 REACHES 85% OF V6; V12DET GOES HIGH; | V12poct GOES LOW | V12po TURNED OFF; |
| 215 | | V12acct, V12sbct GO HIGH; | V12ac, V12sb STARTED; |
| 216 | | V8frct GOES HIGH; | V8fr STARTED; |
| 217 | | WAIT X CYCLES | |
| 218 | | V11acct GOES HIGH; | V11ac STARTED; |
| 219 | | WAIT X CYCLES | |
| 220 | | Vdet GOES LOW | VOLTAGE DETECTOR CIRCUITS TURNED OFF (SAVE BIAS CURRENT); |
| 221 | | PWRon SIGNALS ASSERTED; | ALL VOLTAGES STABLE; |
| 222 | | FINISH. | |

ARRANGEMENT FOR CONTROLLING VOLTAGE GENERATORS IN MULTI-VOLTAGE GENERATOR CHIPS SUCH AS DRAMS

CROSS-REFERENCE TO RELATED APPLICATIONS

This application is related to and drawn from Provisional application Ser. No. 60/079,717, filed Mar. 27, 1998, and has the same inventor and assignee.

FIELD OF THE INVENTION

The present invention relates to an arrangement for controlling the operation of various phases of a multiple voltage generator system used in chips such as Dynamic Random Access Memory (DRAM) chips.

BACKGROUND OF THE INVENTION

Modern chips such as Dynamic Random Access Memory (DRAM) chips have many different voltages that have to be generated on the chip by a plurality of generators that have to be controlled as to their sequence of start-up times, etc. during various operational phases.

U.S. Pat. No. 5,319,601 (Kawata et al.), issued on Jun. 7, 1994, discloses a power supply start-up circuit for a DRAM wherein a rise time of an intermediate potential is made short after the power is switched on, and current consumption is kept low. The power supply circuit comprises both a power-on detection circuit which detects when an external power supply potential reaches a predetermined potential and produces first and second detection signals, and an internal power supply circuit which generates an internal power supply potential. The power supply circuit further comprises a first intermediate potential generating circuit which generates a first intermediate potential from the external power supply potential and supplies it to an intermediate potential supplying node. When the first detection signal is produced and the first intermediate potential reaches a predetermined potential, the first intermediate potential generating circuit stops both the supply of the first intermediate potential to the intermediate potential supplying node and the intermediate potential generating function. A second intermediate potential generating circuit generates a second intermediate potential from the internal power supply potential and, when the second detection signal is produced, supplies the second intermediate potential to the supplying node. The first intermediate potential generating circuit has a larger driving capability than that of the second intermediate generating circuit which makes possible a shortening of the rise time of the intermediate potential after the power is switched-on, and to reduce the overall current consumption.

Referring now to FIG. 1, there is shown a block diagram of a prior art generator control arrangement 10 for controlling generators that generate voltages in, for example, a Dynamic RAM (DRAM) chip. The arrangement 10 comprises a power-on circuit 20, a Generator system (GENERATORS) 22 that comprises Reference Voltage Generators (REF. VOLT.) 23 and a plurality of voltage generators (not shown), Initialization circuits 24, Pull-up circuits 26, and first and second OR gate arrangements 28 and 30, respectively. It is to be understood that the Pull-up circuits 26 and the first and second OR gate arrangements 28 and 30 comprise one or more of such circuits or gates depending on the number of signals being received and processed in parallel by the pull-up circuits 26 and OR gate arrangements 28 and 30.

Signals from Bondpads and Testpads on the associated chip are received in the Pull-up circuits 26. In the Pull-up circuits 26, an output signal is pulled up to a logic high level (logic "1") by default when an input pad is not connected, and a logic "0" is outputted if the input signal is actively pulled down from the pad or connection. The output signals from the Pull-up circuits 26 are logically combined in the first OR gate arrangement 28 with Testmode Register signals that have been initialized in associated Initialization circuits 24. The outputs from the first OR gates 28 are coupled to first inputs of the Power-On circuit 20 and to the Generator system 22. The Testmode Register signals are also initialized in associated Initialization circuits 24 and then coupled to the Generator system 22. Signals from Fuses (not shown) on the associated chip are initialized in associated Initialization circuits 24 and coupled into the Reference generators 23 of the Generator system 22. The fuse signals are also logically combined in the second OR gate arrangement 30 with the input Testmode Register signals and then coupled to the Generator system 22. The Power-On circuit 20 receives the output signals from the first OR gate arrangement 28, and various signals from the Initialization circuits 24, and generates output control signals to both the Initialization circuits 24 and to the generators of the Generator system 22. The Generator system 22 comprises a plurality of voltage generators, including the reference generators 23, and receives an External Voltage (VEXT), system signals (SYS. SIGS.), and the signals from each of the first and second OR gate arrangements 28 and 30, the Initialization circuits 24, and the Power-On circuit 20, and generates output signals to the Initialization circuits 24 and the various voltages (not shown) required by the remote circuits on the associated chip.

To control the operation of these generators, many logic control circuits are involved in the generator functions, which conventionally are performed by local logic circuits (not shown) dispersed throughout the generator system 22 within the individual generator blocks (not shown). The conventional Generator system 22 is the result of a growth process, where additional logic circuitry was added locally whenever new voltage levels and the associated generator blocks were added, or whenever control functionality needed to be changed.

It is desirable to provide an arrangement wherein control of voltage generators on a chip avoids the necessity of logic circuits being dispersed throughout the generator system, and a flexibility for accommodating any changes that may be needed for future modifications of the generator system or chip is possible.

SUMMARY OF THE INVENTION

The present invention is directed to an arrangement for controlling the various modes of a voltage generator system used in Dynamic Random Access Memory (DRAM) and other modules comprising a plurality of generator blocks for producing various voltages required by the module.

Viewed from one aspect, the present invention is directed to a chip comprising a generator system including a plurality of voltage generating circuits, and a centralized generator control arrangement. The centralized generator control arrangement comprises a controller coupled to each of the plurality of voltage generating circuits and to predetermined devices on the chip. The controller is responsive to signals from the predetermined devices on the chip for generating a predetermined sequence of output control signals to the individual generating circuits for each of at least two separate phases of operation of the generator system. Each predetermined sequence of output control signals controls the logic operation sequence of the plurality of generating circuits and the predetermined devices on the chip at defined periods of time so as to produce required stable voltage outputs from the plurality of generating circuits to predetermined circuits on the chip.

Viewed from another aspect, the present invention is directed to a Dynamic Random Access Memory (DRAM) chip comprising a generator system including a plurality of voltage generating circuits for generating voltages to predetermined other generating circuits and to other devices on the chip, and a centralized generator control arrangement. The centralized generator control arrangement comprises a controller coupled to each of the plurality of voltage generating circuits and to predetermined ones of the other devices on the chip. The controller is responsive to occurrences in the plurality of voltage generating circuits and signals from the predetermined ones of the other devices on the chip for generating a predetermined sequence of output control signals to the individual generating circuits for each of at least two separate phases of operation of the generator system. The predetermined sequence of output control signals controls the logic operation sequence of the plurality of generating circuits and the predetermined devices on the chip at defined periods of time so as to produce required stable voltage outputs from the plurality of generating circuits to predetermined circuits on the chip.

The invention will be better understood from the following more detailed description taken with the accompanying drawings and claims.

BRIEF DESCRIPTION OF THE DRAWING

FIGS. 4A and 4B show a Power-on Sequence Table for illustrating an exemplary Power-On sequence for controlling the generator arrangement of FIG. 3 by the exemplary centralized generator control arrangement of FIG. 2.

DETAILED DESCRIPTION

Figure 2:
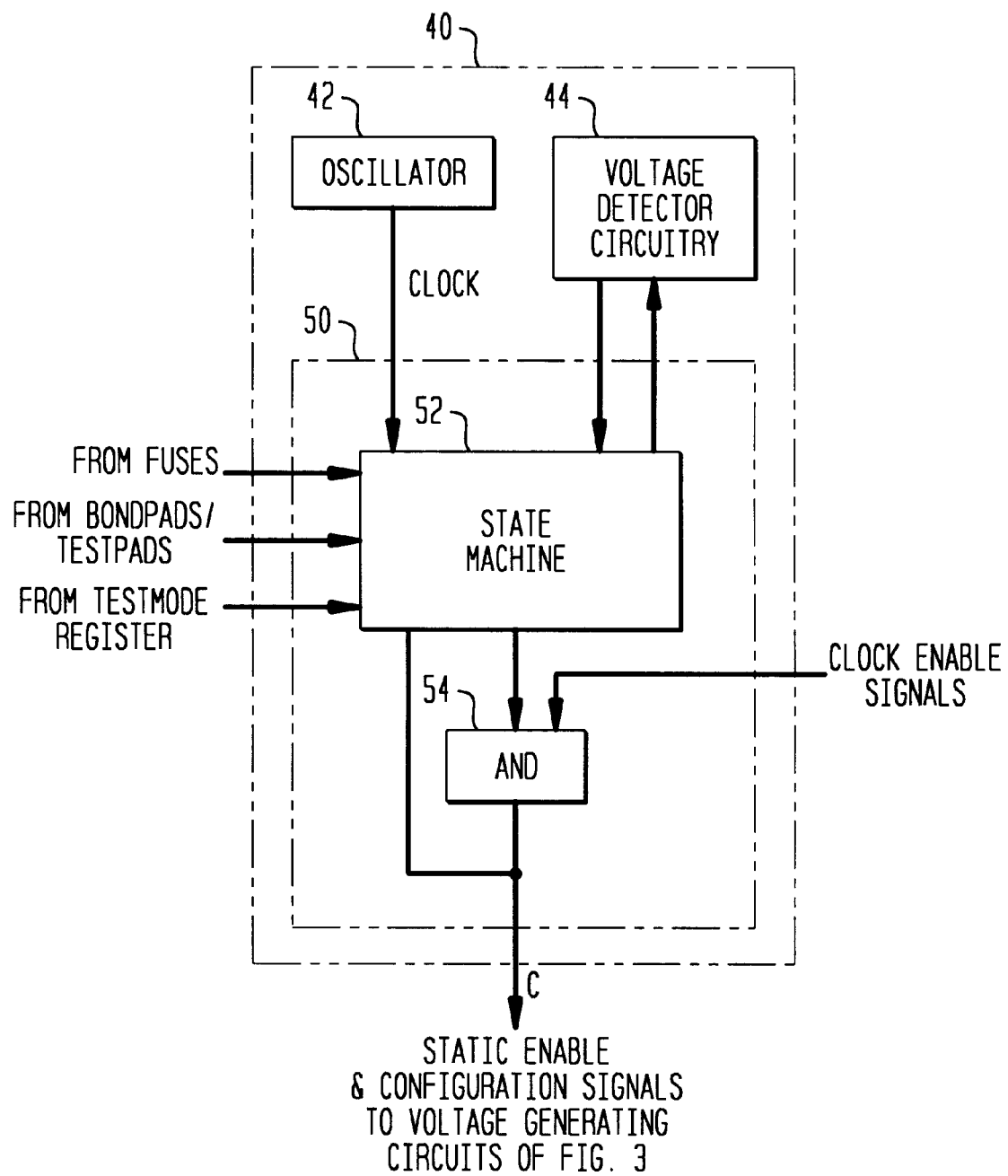
FIG. 2 is a block diagram of an exemplary centralized generator control arrangement for controlling various voltage generators on multi-generator chips, such as a Dynamic RAM chip, in accordance with the present invention.

Referring now to FIG. 2, there is shown a block diagram of an exemplary centralized generator control arrangement 40 (shown within a dashed line rectangle) for controlling various voltage generating circuits (shown in FIG. 3) on an integrated circuit chip having multiple voltage generator circuits, such as a Dynamic RAM chip, in accordance with the present invention. The centralized generator control arrangement 40 comprises a controller 50 (shown within a dashed line rectangle), an oscillator 42 for providing clock signals to the controller 50, and voltage detector circuitry 44 that receives signals from the controller 50 and transmits generated control signals back to the controller 50. The controller 50 comprises a state machine 52 and an AND gate 54. The state machine 52 is a well-known device that comprises a processor which uses a memory (not shown) that stores program instructions for operating the processor in a predetermined manner.

Figure 5:
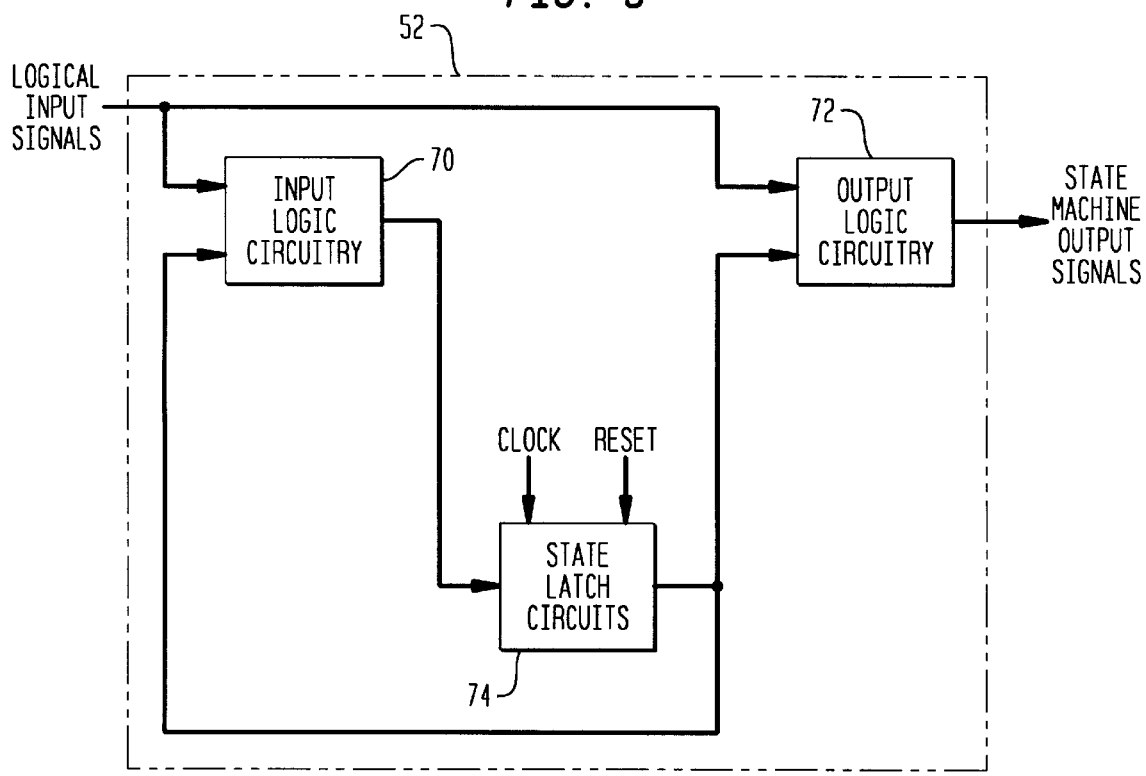
FIG. 5 shows an exemplary arrangement for a state machine in the exemplary centralized generator control arrangement of FIG. 2.

Referring now to FIG. 5, the state machine 52 can alternatively comprise input logic circuitry 70, output logic circuitry 72, and state latch circuits 74. The input logic circuitry 70 and output logic circuitry 72 generally receive all logical input signals to the controller (e.g., Bondpads/Testpad, Testmode register, Fuses, and Voltage Detector circuits 44 signals) and provide necessary logic functions via the use of various gates to generate appropriate output control signals. The state latch circuits 74 may comprise flip-flops (not shown) that receive signals from the input logic circuitry 70, and other signals such as Reset signals and clock signals, and generate appropriate output signals to the input and output logic circuits 70 and 72.

Returning now to FIG. 2, the state machine 52 receives the clock signals from the oscillator 42, control signals from the voltage detector circuitry 44, and signals from various fuses, bondpads and testpads, and testmode registers, and generates output signals based on the program instructions found in its memory. The AND gate 54 receives clock enable signals and predetermined output signals from the state machine 52, and generates output signals which are combined with other predetermined output signals from the state machine 52 to form static enable and configuration output signals "C" from the centralized generator control arrangement 40 which are transmitted to the various voltage generating circuits to be controlled. An exemplary operation of the controller 50 will be described hereinafter in association with a description of FIGS. 4A and 4B.

The voltage detector circuitry 44 measures an External supply voltage (VEXT shown in FIG. 3) and certain of the voltages generated by predetermined ones of a plurality of generating circuits (shown in FIG. 3) and sends respective signals to the controller 50 once these voltages have reached their specific threshold values. It is to be understood that any suitable well known voltage detecting circuits can be used to perform these functions.

Figure 3:
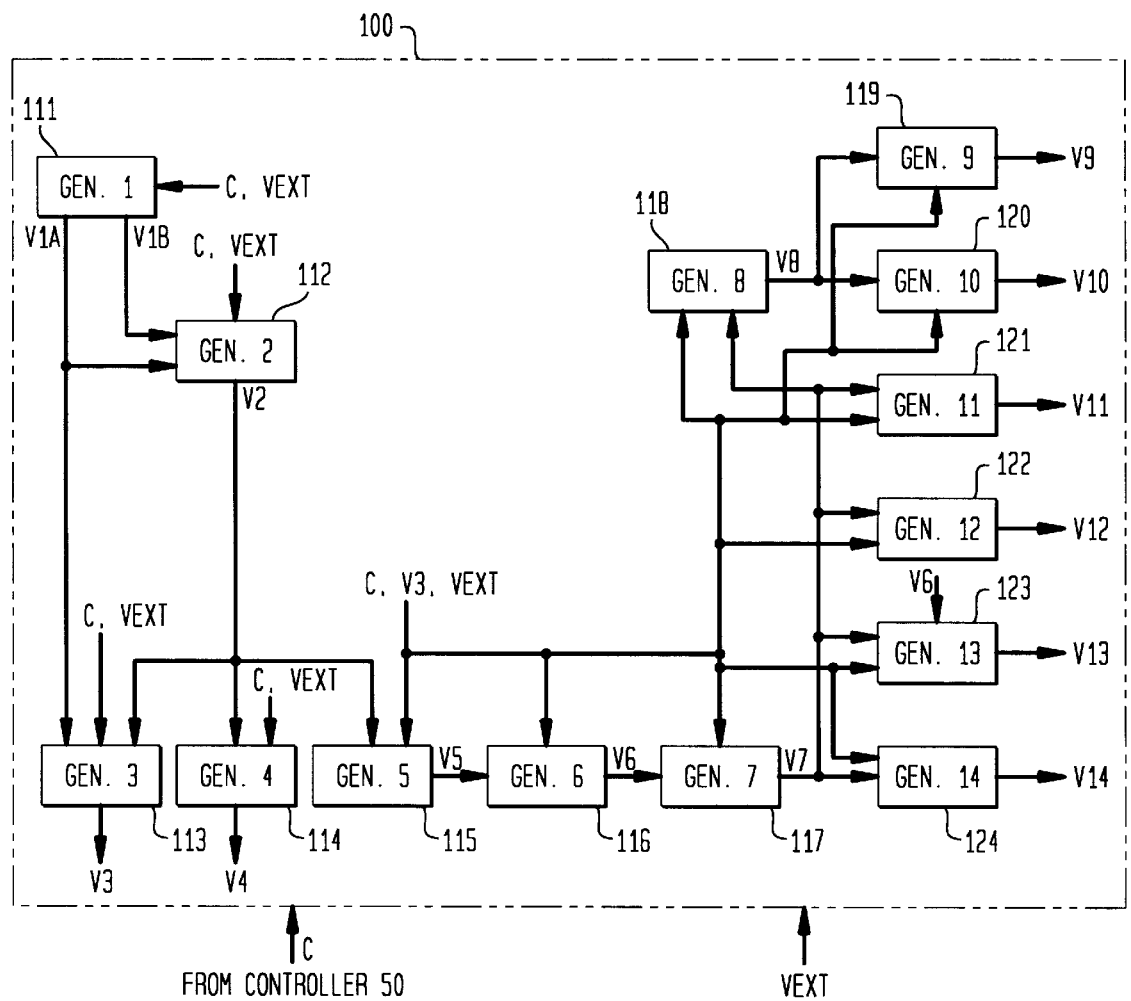
FIG. 3 is a block diagram of an exemplary voltage generator system, in accordance with the present invention, comprising a plurality of voltage generators on a multi-generator chip, such as a Dynamic RAM, that are controlled by the centralized generator control arrangement of FIG. 2.

Referring now to FIG. 3, there is shown a block diagram of an exemplary voltage generator system 100 (shown within a dashed-line rectangle) in accordance with the present invention. System 100 comprises a plurality of voltage generating circuits 111–124 (GEN. 1–GEN. 14, respectively) on a multi-generator chip, such as a Dynamic RAM, that are controlled by the centralized generator control arrangement 40 of FIG. 2. In the exemplary voltage generator system 100, each of the voltage generating circuits 111–124 receives a separate control signal "C" from the controller 50 of FIG. 2, and a predetermined external voltage (VEXT). It is to be understood that to simplify the drawing, the control signal "C" and the predetermined external voltage (VEXT) are shown as being applied to each of the voltage generating circuits 111–124 over a single input conductor. In actuality, these inputs are provided to each of the voltage generating circuits 111–124 over separate conductors. In addition to the control signal "C" and the predetermined external voltage (VEXT), it is shown that an output (V3) from voltage generating circuit 113 is applied to each of voltage generating circuits 115–124, and an output (V6) from the voltage generating circuit 116 is provided as an input to voltage generating circuit 123.

In the exemplary voltage generator system 100, voltage generating circuit 111 (GEN. 1) is responsive to the control signal "C" from controller 50 meant therefor and the predetermined external voltage (VEXT), for generating both a first output voltage (V1A) that is coupled to both first inputs of each of voltage generating circuits 112 (GEN. 2) and 113 (GEN. 3), and a second output voltage (V1B) that is coupled to a second input of the voltage generating circuit 112. The voltage generating circuit 112 is responsive to the first and second voltages V1A and V1B from voltage generating circuit 111, the control signal "C" meant therefor, and the predetermined external voltage (VEXT), for generating an output voltage (V2) that is coupled to a second input of the voltage generating circuit 113, and inputs of each of the voltage generating circuits 114 (GEN. 4) and 115 (GEN. 5). The voltage generating circuit 113 is responsive to the control signal "C" meant therefor, the predetermined external voltage (VEXT), and the voltages V1A and V2 received from voltage generating circuits 111 and 112, respectively, for generating an output voltage (V3) that is provided as inputs to voltage generating circuits 115–124, and as an output signal from the voltage generator system 100.

The voltage generating circuit 114 is responsive to the control signal "C" meant therefor, the predetermined external voltage (VEXT), and the voltage V2 received from the voltage generating circuit 112 for generating an output voltage (V4) that is provided as an output signal from the voltage generator system 100. The voltage generating circuit 115 is responsive to the control signal "C" meant therefor, the predetermined external voltage (VEXT), the voltages V2 and V3 received from the voltage generating circuits 112 and 113, respectively, for generating an output voltage (V5) that is provided as an input signal to the voltage generating circuit 116 (GEN. 6). The voltage generating circuit 116 is responsive to the control signal "C" meant therefor, the predetermined external voltage (VEXT), the voltages V3 and V5 received from the voltage generating circuits 113 and 115, respectively, for generating an output voltage (V6) that is provided as an input signal to the voltage generating circuits 117 (GEN. 7) and 123 (GEN. 13). The voltage generating circuit 117 is responsive to the control signal "C" meant therefor, the predetermined external voltage (VEXT), the voltages V3 and V6 received from the voltage generating circuits 113 and 116, respectively, for generating an output voltage (V7) that is provided as an input signal to the voltage generating circuits 118, 121, 122, 123, and 124.

The voltage generating circuit 118 (GEN. 8) is responsive to the control signal "C" meant therefor, the predetermined external voltage (VEXT), the voltages V3 and V7 received from the voltage generating circuits 113 and 117, respectively, for generating an output voltage (V8) that is provided as an input signal to the voltage generating circuits 119 (GEN. 9) and 120 (GEN. 10). The voltage generating circuit 119 is responsive to the control signal "C" meant therefor, the predetermined external voltage (VEXT), the voltages V3 and V8 received from the voltage generating circuits 113 and 118, respectively, for generating an output voltage (V9) that is provided as an output signal from the voltage generator system 100. The voltage generating circuit 120 is responsive to the control signal "C" meant therefor, the predetermined external voltage (VEXT), the voltages V3 and V8 received from the voltage generating circuits 113 and 118, respectively, for generating an output voltage (V10) that is provided as an output signal from the voltage generator system 100. The voltage generating circuits 121 (GEN. 11), 122 (GEN. 12), and 124 (GEN. 14) are each responsive to the control signal "C" meant therefor, the predetermined external voltage (VEXT), the voltages V3 and V7 received from the voltage generating circuits 113 and 117, respectively, for generating output voltage V11, V12, V13, and V14, respectively, that are provided as an output signals from the voltage generator system 100. The voltage generating circuit 123 (GEN. 13) is responsive to the control signal "C" meant therefor, the predetermined external voltage (VEXT), the voltages V3, V6, and V7 received from the voltage generating circuits 113, 116, and 117, respectively, for generating output voltage V13 that is provided as an output signals from the voltage generator system 100.

The voltage generator system 100 can be equated to generator systems on modern DRAM chips and Synchronous DRAM chips which have more than ten voltages that are generated on the chip by many voltage generating circuits. These voltages include several reference voltages (e.g., for Input/Output receivers, and for bias current generation in analog circuits), as well as several voltages that supply different functional blocks (not shown) of the DRAM with high or low operating current (e.g., for sense amplifiers or word line drivers). Basically, three different phases of operation occur for the various generating circuits in the voltage generator systems 22 of FIG. 1 and 100 of FIG. 3 which can be indicated as (a) a normal operation phase, (b) a test and burn-in phase, and (c) a power-on phase.

Figure 1:
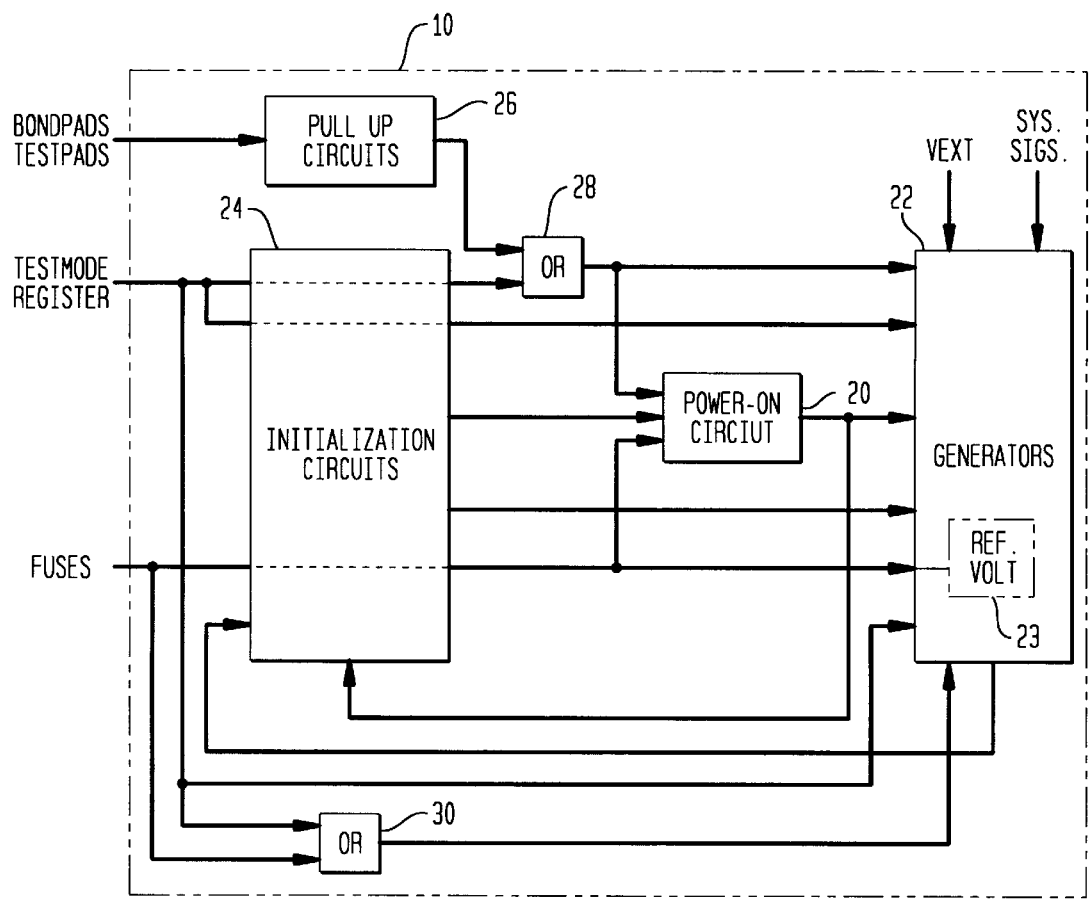
FIG. 1 is a block diagram of a prior art generator control arrangement for controlling voltages in multi-generator chips, such as Dynamic RAM chips.

During a "normal operation" phase in either one of generator systems 22 of FIG. 1 or 100 of FIG. 3, the generating circuits (e.g., generating circuits 111–124 of FIG. 3) have to guarantee that all voltages provided on the chip are stable, and that all required currents drawn from several power networks (not shown) are supplied on the chip. Still further, it has to be ensured that the generating circuits themselves do not consume too much current (e.g., bias current in differential amplifiers, and current through resistor dividers). Therefore, power networks that have to supply peak currents (e.g., for sensing operations) are usually fed by one or more of several types of generating circuits such as a stand-by generating circuit, an active generating circuit, and a peak current generating circuit. The stand-by generating circuit is always turned on and can supply only little current, but itself also consumes only little current. Its purpose is to maintain the voltage level during those times and phases when the chip is not active. An active generating circuit is only activated when the chip performs a function that requires current from a respective power network. The active generating circuit can supply a large current but also consumes a larger current. In order to activate an active generating circuit, signals from other chip functions (e.g., the sense amplifier enable signals that activate the sense amplifiers) (not shown in the figures) are also evaluated by the generator system 22 of FIG. 1 or the controller 50 of FIG. 2 in order to activate the active generating circuit. At times, a peak current generating circuit is used to supply high peaks of current that is drawn from a power network. A peak current generating circuit might consist of, for example, only of a transistor-switch between a respective power network and either an external voltage supply (VEXT) or a current source to this power network. Peak current generating circuits are turned on for a short period of time at the exact moment when the peak current is drawn from the power network. The peak current generating circuits usually have no regulation function themselves, but the final regulation of the voltage therefrom is done by an above-mentioned active generating circuit. In order to turn the peak current generating circuits on at the right moment, signals from other chip functions are connected to the generator system (e.g., the sense amplifier enable signals).

Still further, there is some interaction between the voltage generating circuits for different power networks. For example, if a first one of the voltage generating circuits (e.g., Generating circuit 123) that is providing a voltage for word line boosting on the DRAM chip is active to restore a full voltage level, then this voltage generating circuit will send a signal to a second one of the predetermined voltage generating circuits (e.g., generating circuit 116). This signal will prevent the second one of the predetermined voltage generating circuits from being turned off because the first one of the voltage generating circuits itself consumes current from the second one of the voltage generating circuits. Since a DRAM chip often can be used for memory devices with different configurations which require different drive capabilities of certain voltage generating circuits, the voltage generating circuits have to be configured for those situations. This is done by bondpads or by fuses, where the information from the bondpads and/or fuses is transmitted to the conventional generator system 22 of FIG. 1, or to the controller 50 of FIG. 2.

To control these generating circuits during the different phases of operation in the conventional voltage generator system 22 of FIG. 1, many logic control circuits are involved in the generating circuit functions, which are performed by local logic circuits (not shown) dispersed throughout the generator system 22 and within the individual generating circuit blocks (not shown). As a result, the conventional voltage generator system 22 involves a complex controlling scheme. In accordance with the present invention, logic control circuits are no longer distributed across all of the generating circuits 111–124. Instead, the state machine 52 of the controller 50 receives all of the input signals, and is programmed to provide individual control signals to each of the generating circuits 111–124 in order to turn the appropriate generating circuits 111–124 on or off at predetermined times during each of the possible phases of operation. It is to be understood that the program for the state machine 52 for each phase of operation is arbitrary in that a designer must define a desired sequence of operation for each possible phase of operation. Once such sequence of operation is determined, it can be easily converted into a corresponding program instruction sequence for the state machine 52 that causes the corresponding operation of the generator system 100 in response to predetermined input signals received by the state machine 50.

In a Test and Burn-in phase, the generating circuits have to perform many additional functions beyond their normal operation. For example, one function may be that certain or all generating circuits can be disabled for test purposes. A second function may be that certain voltages are set to a different value as compared to the normal operation. A third function may be that certain time constants in the generating circuits, which determine their dynamic behavior, can be changed in order to determine the best value for optimum chip functions. A fourth function may be that to stress the chip (burn-in test), most internal voltages have to be set to a higher value than in the normal operation, which can be done by setting VEXT to a higher value and allowing an internal reference voltage to follow this rise of the external voltage.

A Power-On phase is defined as a transient state during which the external voltage VEXT has already been applied to the chip but the internal voltages have not been established. There are two main requirements for the Power-On phase. Such requirements are that it has to be short (e.g., 100 microseconds), and it has to happen in a well defined way. To keep the Power-On phase short, several additional functions have to be performed by the generator system 100. Since all power networks have to be charged from zero volts to their respective level in a short time, the drive capability of several generating circuit blocks is not sufficient. Several possible solutions exist to overcome this problem. First, during a first phase of the Power-On phase, power networks are shorted by transistor switches to VEXT until they have almost reached their desired value. Then, these switches are opened again and the respective generating circuit block takes over the regulation of this voltage. Second, the drive capability of some generating circuits (e.g., pump circuits) depends on the frequency of oscillators that drive these pump circuits. During the Power-On phase, high frequency oscillators are connected to the pump circuits to enable fast pumping operation and then, after the Power-On phase, slower oscillators are used to drive these pump circuits, and the fast oscillators are turned off to save power. A static enable signal provided at the output of the controller 50 is used generally for enabling a generating circuit block (e.g., in the Power-On phase, or for turning it off during a test-mode phase), and this signal is not time critical. Configuration signals at the output of the controller 50 are used to change the behavior of one or more a predetermined generating circuit blocks in a specific way, such as by changing its voltage level (trimming), changing its drive capability, changing its internal time constants, or specific functions for test-modes. These signals are also not time critical and do not change during the normal operation of the chip. It is to be understood that within the generator system 100, there are generated dynamic enable signals and message signals. Dynamic enable signals are used for activating a generating circuit when it has to start regulating its output voltage, or has to start to produce current (e.g., peak generating circuits). These signals are time critical and not every generating circuit requires such input signal (e.g., a stand-by generating circuit). Message signals are signal used for communicating between generating circuit blocks which, for example, may tell one generating circuit that its input pump voltage level is not yet established and that the pumping generating circuit supplying the pump voltage is still running. This will cause the one generating circuit to delay its turn off although a dynamic enable signal thereto has already been turned off. These signals are also time critical and not every generating circuit requires such input signal.

Referring now to FIGS. 4A and 4B, there is shown a Power-On Sequence Table for illustrating an exemplary sequence for controlling the generator system 100 of FIG. 3 for a Power-On phase of operation by the exemplary centralized generator control arrangement 40 of FIG. 2. In section 200 of the Table, the external voltage (VEXT) is applied to the chip to begin the sequence. The application of VEXT to the chip causes the state machine 52 in the controller 50 to reset predetermined flip-flops (not shown in FIG. 2) in the controller 50, and place a "V6on" signal in the low state so that all circuits that receive the "V6on" signal from the controller 50 will stay inactive. At this time, generating circuit 111 is activated to start generating the voltages V1A and V1B, generating circuit 112 is activated to start generating the voltage V2, generating circuit 113 is activated to start generating the voltage V3, generating circuit 114 is activated to start generating the voltage V4, generating circuit 115 is activated to generate V5 and cause an initial pull-down of a node (not shown), generating circuit 117 is activated to generate V7 and provide an initial activation of a boost switch (not shown), generating circuit 116 is activated and placed in the stand-by mode to generate a V6acc (V6 active) and a V6sbm (V6 stand-by mode) signal, generating circuit 118 is activated to start generating the voltage V8, the signal V6osb (V6 on stand-by) started, the generating circuit 119 starts generating the voltage V9, and the generating circuit 120 starts generating the voltage V10. In the controller 50, a "bFINIT" (bFuse Initialize) fuse latch signal is placed in a low state while a "bFSET" (bFuse Set) signal is placed in a high state. The "bFINIT" and "bFSET" signals are exemplary signals for fuses on the chip. The information of those fuses is not applied to the chip, but in the exemplary Power-On phase this fuse information might be latched into predetermined flip-flops (not shown) in, for example, the controller 50. These are two fuse signals which require a certain timing as to when they go high or go low in order to organize or control the latching of the fuse information into the predetermined flip-flops. Since fuses are dispersed all over a chip, it is important to know that the voltage V6 is already well established all over the chip before the fuse information is latched, otherwise a logical "0" might be latched when it is actually a logical "1" because the circuits, and the voltage supplying these circuits, are not yet stable.

In section 201 of the Table, the controller 50 waits for a predetermined number of X clock cycles (e.g., X=10) at which time it is known that the voltage V6 from the generating circuit 116 (which has been activated and placed in the stand-by mode in section 200) should have reached a predetermined level. In section 202 of the Table, it is detected by the voltage detector 44 that V13 (voltage from generating circuit 123) is at a required level (low or high), and the voltage detector 44 detects that the voltage V6 has reached a predetermined high threshold level, the voltage detector 44 transmits a V6DET signal to the controller 50 which indicates that the voltage V6 is well established all over the chip. In section 203 of the Table, the controller knowing that the voltage V6 is at its proper level, waits another X clock cycles before starting section 204. In section 204 of the Table, the "V6on" signal in the controller 50 goes high, and the Voltage V3 drive capability is reduced, the voltage V5 is no longer in the pull-down state, and the voltage V7 activation of the boost switch is turned off. In the beginning of the Power-On phase, the generating circuit 117 is assumed to require a large V7 drive capability which is activated by its boost switch in section 200 and then reduced in section 204 when the large drive capability is no longer required.

In section 205 of the Table, the controller 50 generates a "V14sbct" (V12 stand-by circuit) signal the generating circuit 124 starts to generate the voltage V14. In section 206 of the Table, the controller 50 generates "V13acct" (V13 activate circuit) and "V13sbct" (V13 stand-by circuit) signals which causes generating circuit 123 to be activated and placed in the stand-by mode. In section 207 of the Table, the controller generates fuse latch signals and the bFINIT signal goes high. In section 208–211 of the Table, the controller goes through a sequence of waiting for Y clock cycles (section 208), making bFSET go low (section 209) and waiting for Z clock cycles (section 210) before making bFSET go high (section 211). It is to be understood that the bFINIT and bFSET signals go to other circuits on the chip and not to the any of the generating circuits 111–124 since no generating circuits are shown as performing any action in the column labeled "Generator Circuits". The flip-flops controlled by the bFINIT and bFSET signals are generally controlled by intermediate circuits, and these circuits require a special timing of the bFINIT and bFSET signals.

In the present generator arrangement 100 shown in FIG. 3, it is assumed that the generating circuit 123 is a pump generator including an associated power network that receives the VEXT voltage (which by standards can only have a predetermined maximum value), and pumps this input voltage to provide a negative output signal V13 (e.g., −0.5 volts). Similarly, generating circuit 122 is assumed to be a pump generator that receives the VEXT voltage and pumps this input voltage to provide a positive output signal V12 (e.g., 3.5 volts). In section 212 of the Table, the voltage V13 from generating circuit 123 reaches its predetermined level and a V13LMT (V13 Limit) detection signal is generated which causes the controller 50 to make the "V13acct" (from section 206) to go low, and the "V13ac" activate signal in generating circuit 123 to be turned off. In section 213 of the Table, the controller 50 generates a "V12poct" (V12 Power-On Circuit) control signal which goes high, and the power network (not shown) associated with generating circuit 122 is started. In section 214 of the Table, the voltage V12 has been found to reach a predetermined level (85%) of the value of the voltage V6, and a V12DET (V12 detection) signal from the voltage detector 44 goes to a predetermined high value. This causes the controller 50 to generate the V12poct (from section 213) which goes low and causes the power network of the generating circuit 122 to be turned off. In section 215 of the Table, the controller generates a "V12acct" and "V12sbct" that goes high, which, in turn, causes the generating circuit 122 to be activated and placed in the stand-by state. The reason for sections 212–215 of the Table is that pump generating circuits 122 and 123 cannot be turned on and go immediately from 0 volts to their proper output voltage, which is much higher or lower than the VEXT applied voltage. Therefore, this requires a stretching out of the turning on of these types of generating circuits. For example, the power network (not shown) associated with generating circuit 123 has to be pulled high to a certain level which is, for example, 85% of the voltage V6 from generating circuit 116, and only then can the pump generating circuit 123 begin to function properly. That occurs by turning on a device (not shown) called the "V13 power" circuit which is a pump itself and pulls the generating circuit 123 power network to a high state. Once the network has reached a predetermined level, the network is turned off again and the pump generating circuit 113 starts operating.

In section 216 of the Table, the controller generates a "V8frct" (V8 feedback regulator circuit) control signal that goes high and causes a feedback regulator circuit of generating circuit 118 to start operating and cause the voltage V8 to be generated. In sections 217–220, the controller 50 waits for X clock cycles (section 217), then generates a "V11acct" control signal which causes the generating circuit 121 to start generating the voltage V11 (section 118), the controller 50 again waits for X clock cycles before generating a "Vdet" (Voltage Detector) control signal that turn off the Voltage Detector 44 since it is no longer needed and to save bias current that would be used therein. In sections 221 and 222 of the Table, the controller 50 asserts a "PWRon" (Power On) control signal that indicates that all of the voltages from generating circuits 111–124 are stable (section 121), and the Power-On phase is concluded (section 122) since the generating circuits have been started and have reached the correct power-on levels.

It is to be understood that similar sequence tables can be originated by a designer for any of the phases of operation required on a chip, and then converted into corresponding program instructions for use by the state machine 52 of controller 50 in order to control the generating circuits 111–124 for each of the different required phases of operation.

Advantages of the present centralized generator control arrangement 40 is that the logic control functions and the voltage generating functions are clearly separated. Therefore, the overall system can be verified easily because all functions can be verified individually, and changes can be made with great flexibility in that signal aspects of its function can be changed or replaced without side effects to other functions. More particularly, the logic behavior of the system is determined by the specification of the state machine 52, and changes in logic behavior are simply made and do not affect the voltage generation circuits. Still further, as an example, the sequencing for the Power-On phase of operation does not need additional delay circuitry since all delays are performed in the state machine 52 because the state machine 52 is inherently a "sequencer". Additionally, the initialization of test mode signals and fuse signal does not need additional circuitry since this is inherently performed in the state machine 52 because it only has to be specified that these signals are not being evaluated during the Power-On sequence.

It is to be appreciated and understood that the specific embodiments of the present invention described hereinabove are merely illustrative of the general principles of the invention. Various modifications may be made by those skilled in the art which are consistent with the principles set forth. For example, it is to be understood that similar sequence tables can be originated for each of the phases of operation required on a chip, and then converted into corresponding program instructions for use by the state machine 52 of controller 50 in order to control the generating circuits 111–124 for each of the different phases of operation. Still further, the Sequence Table of FIGS. 4A and 4B is merely an exemplary sequence that may be used for the Power-On phase, and any other desired sequence can be substituted therefor.

What is claimed is:

1. An arrangement for controlling voltage generators in a multi-voltage generator chip comprising:

a generator system comprising a plurality of voltage generating circuits for generating a plurality of different predetermined voltages for use by a group consisting of predetermined ones of the voltage generating circuits and predetermined circuits on the chip; and a centralized generator control arrangement comprising a controller coupled to each of the plurality of voltage generating circuits and to predetermined devices on the chip, the controller being responsive to signals from the predetermined devices on the chip for generating a predetermined selective sequence of output control signals to the individual generating circuits for each of at least two separate phases of operation of the generator system in order to control a predetermined logic operation sequence of the plurality of generating circuits and the predetermined devices on the chip at defined periods of time during a current phase of operation so as to produce required stable voltage outputs from the plurality of generating circuits to the predetermined circuits on the chip.

2. The arrangement of claim 1 wherein the centralized generator control arrangement further comprises a voltage detecting arrangement for detecting voltage threshold levels in predetermined ones of the plurality of voltage generating circuits, and for generating output signals to the controller representative of the detected voltage levels.

3. The arrangement of claim 1 wherein the controller comprises a state machine that operates on a separate program sequence for controlling the generator system and the predetermined devices on the chip for each phase of operation.

4. The arrangement of claim 1 wherein the controller comprises a state machine that comprises:

input logic circuitry for receiving logical input signals to the state machine and for generating predetermined output control signals corresponding to reactions to the received logical input signals;

latching circuits responsive to the output control signals from the input logic circuitry and predetermined other input signals for generating predetermined output signals; and output logic circuitry for receiving logical input signals to the state machine and the output signals from the latching circuits for generating predetermined output control signals of the state machine.

5. The arrangement of claim 1 wherein the chip is a Dynamic Random Access Memory chip.

6. The arrangement of claim 1 wherein the at least two separate phases of operation comprise a Power-On and a Normal phase of operation.

7. A Dynamic Random Access Memory (DRAM) chip comprising:

a generator system comprising a plurality of voltage generating circuits wherein each voltage generating circuit generates at least one output voltage that is selectively supplied as an input to at least one of a group consisting of (a) at least one of the other voltage generating circuits, and (b) other predetermined devices on the chip; and a centralized generator control arrangement comprising a controller coupled to each of the plurality of voltage generating circuits and to predetermined ones of the other devices on the chip, the controller being responsive to occurrences in the plurality of voltage generating circuits and signals from the predetermined ones of the other devices on the chip for generating a predetermined sequence of output control signals to the individual generating circuits for each of at least two separate phases of operation of the generator system in order to control the logic operation sequence of the plurality of generating circuits and the predetermined devices on the chip at defined periods of time so as to produce required stable voltage outputs from the plurality of generating circuits to predetermined circuits on the chip.

8. The chip of claim 7 wherein the centralized generator control arrangement further comprises a voltage detecting arrangement for detecting voltage threshold levels in predetermined ones of the plurality of voltage generating circuits, and for generating output signals to the controller representative of the detected voltage levels.

9. The chip of claim 7 wherein the controller comprises a state machine that operates on a separate program sequence for controlling the generator system and the predetermined devices on the chip for each phase of operation.

10. The chip of claim 7 wherein the controller comprises a state machine that comprises:

input logic circuitry for receiving logical input signals to the state machine and for generating predetermined output control signals corresponding to reactions to the received logical input signals;

latching circuits responsive to the output control signals from the input logic circuitry and predetermined other input signals for generating predetermined output signals; and output logic circuitry for receiving logical input signals to the state machine and the output signals from the latching circuits for generating predetermined output control signals of the state machine.

11. The chip of claim 7 wherein the at least two separate phases of operation comprise a Power-On and a Normal phase of operation.

* * * * *